United States Patent [19]
Reed

[11] Patent Number: 4,828,654
[45] Date of Patent: May 9, 1989

[54] VARIABLE SIZE SEGMENTED ANODE ARRAY FOR ELECTROPLATING

[75] Inventor: Ronald G. Reed, Colorado Springs, Colo.

[73] Assignee: ProtoCAD, Inc., Colorado Springs, Colo.

[21] Appl. No.: 172,195

[22] Filed: Mar. 23, 1988

[51] Int. Cl.$^4$ .................. C25D 5/00; C25D 17/12
[52] U.S. Cl. ................................ 204/23; 204/231; 204/240
[58] Field of Search ............... 204/15, 23, 231, 238, 204/240, 276

[56] References Cited

U.S. PATENT DOCUMENTS 3,880,725  4/1975  Van Raalte ..................... 204/15

*Primary Examiner*—T. M. Tufariello
*Attorney, Agent, or Firm*—John R. Ley

[57] ABSTRACT

An anode used in electroplating is formed by a plurality of individual anode segments. The anode segments are arranged in predetermined patterns. The segments of certain patterns are selectively energized to establish an effective anode size that relates to the size of the article to be electroplated, thereby establishing an electrical field of uniform characteristics to transfer ions from the anode to the article at a uniform deposition rate over the whole surface of the article. By adjusting the effective size of the anode to correspond or relate to the size of the article, the non-uniform deposition rates associated with concentrated localized field are avoided, and the physical size of the electroplating apparatus can be reduced. An electrophoretic ion filter is also placed between the cathode and the article. This ion filter is preferably formed of a plastic porex material, such as porous polypropylene or polyethylene.

18 Claims, 2 Drawing Sheets

U.S. Patent    May 9, 1989    Sheet 1 of 2    4,828,654
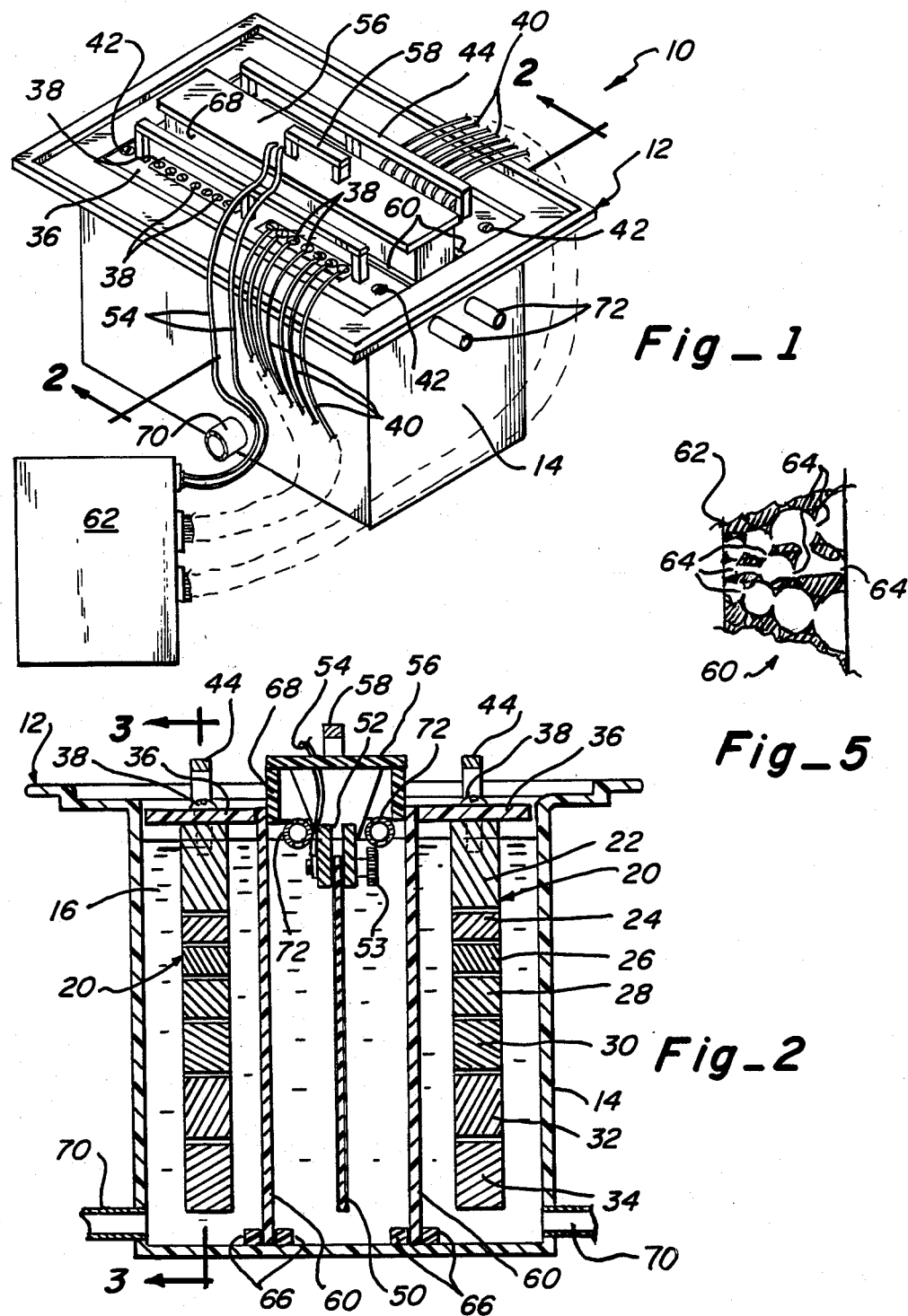
Fig_1
Fig_5
Fig_2

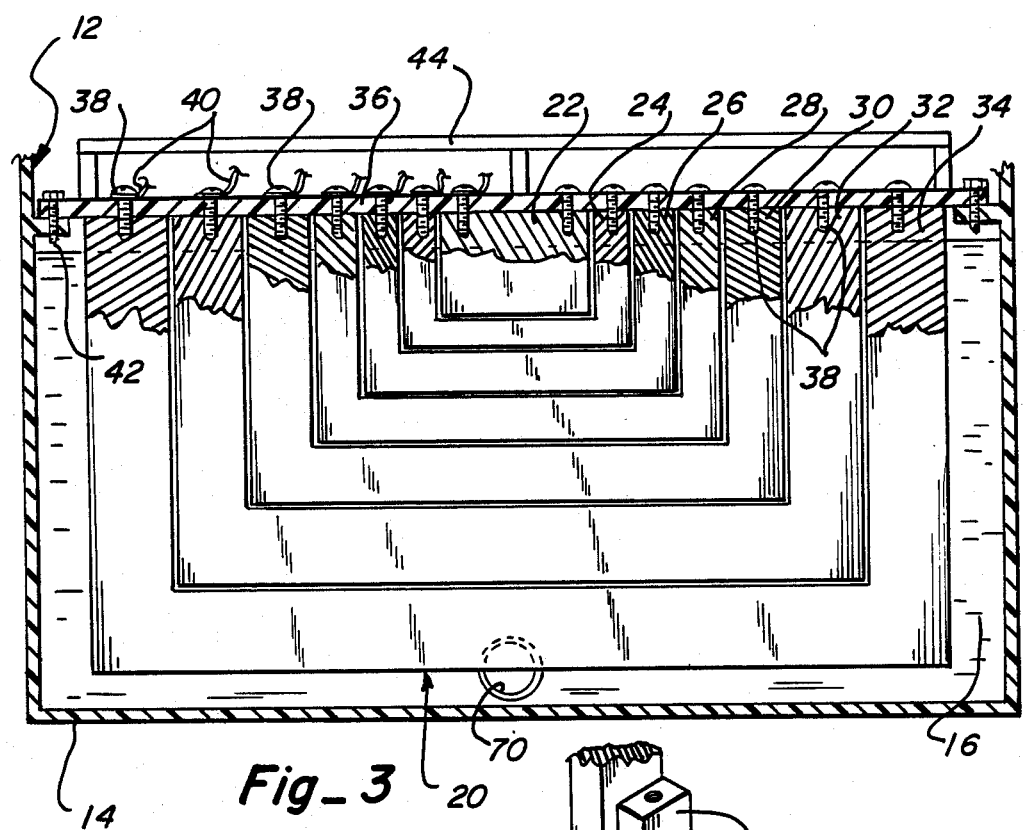
Fig_3
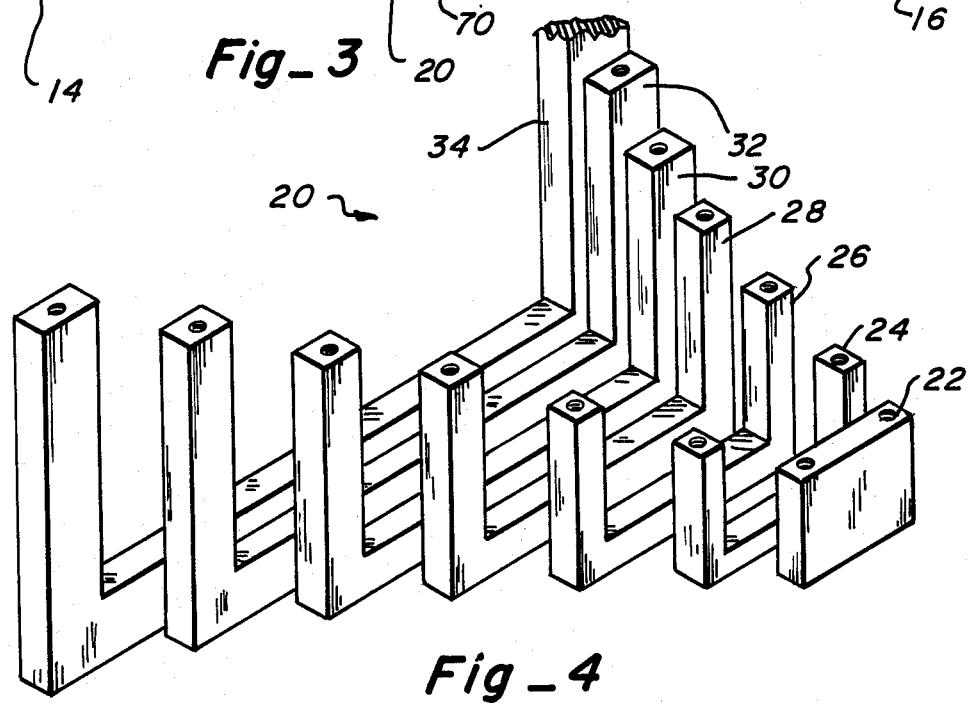
Fig_4

VARIABLE SIZE SEGMENTED ANODE ARRAY FOR ELECTROPLATING

TECHNICAL FIELD OF THE INVENTION

This invention relates to electroplating or electrodeposition of metal, for example copper used in printed circuit board manufacturing for forming plated through-holes in printed circuit boards. More particularly, the present invention relates to improvements in electroplating, specifically a variable sized anode configuration to allow the effective size of the anode to be varied to accommodate different sized articles to be plated, and an improved means of electrophoretically filtering fines from the electroplating bath.

CROSS-REFERENCE TO RELATED SUBJECT MATTER

The subject matter of the present invention is particularly useful in manufacturing printed circuit boards, when employed in conjunction with the techniques disclosed in U.S. Pat. No. 4,720,798, assigned to the assignee hereof. The subject matter described herein is also very useful when electrolytically depositing material to produce plated through-holes in a printed circuit board, when used in conjunction with the techniques described in U.S. patent application for Forming Plated Through Holes in a Printed Circuit Board by Using a Computer Controlled Plotter, Ser. No. 929,390, filed Nov. 10, 1986, and a U.S. patent application for Plated Through-Holes in a Printed Circuit Board, Ser. No. 172,199, filed, Mar. 23, 1988, both of which were invented by the inventor hereof and are assigned to the assignee hereof. The subject matter described in these applications and in the patent is incorporated herein by this reference.

BRIEF DESCRIPTION OF PRIOR ART

The normal practice in the electroplating industry is to establish a relatively large sized electroplating bath. A number of round bars of a prescribed alloy of the metal to be electrolytically plated on the article are positioned in the bath as the anode. For example, 4% phosphorized copper is commonly used in copper electroplating. Alternatively, a basket of small pieces of the alloy may be suspended in the bath to form the anode. At a relatively large distance spaced from the anode, a panel of a uniform size is placed. The panel holds the article or articles upon which the ions of metal are to be electroplated. These articles are electrically connected through the panel and become the electroplating cathode. If an individual article to be electroplated is smaller than the panel, it is generally required that the panel be filled to approximately its full size with additional or other articles.

By spacing the cathode a relatively large distance from the anode, and by making the effective size of the cathode (the articles in the panel) larger in size than the anode, there is a more uniform distribution of the electroplating field. The more uniformly distributed field causes the metallic ions to be electrolytically deposited at a uniform rate over the article(s) in the panel. This prior art arrangement avoids the undesirable situation of having uneven plating building up on the articles at those areas where there is a concentration of the electroplating field. Field concentrations occur when the size of the article is smaller than the size of the anode, and results in the edges (usually) of the article experiencing a substantially greater buildup of metallic ions than the center area of the article. Making the effective size of the cathode (the articles in the panel) greater than the size of the anode and spacing the anode a relatively large distance from the cathode, discourages the formation of areas of concentration in the electroplating field and encourages the ion transfer to become more uniform over the entire area of the cathode.

The prior art arrangement is satisfactory in situations where articles are being electroplated in mass production. However, when individual articles need to be electroplated, as would be the case with a single relatively small printed circuit board, the prior art technique is very difficult or unsatisfactory to utilize.

It is also normal prior practice in electroplating to use some form of electrophoretic fines filtering. Electrophoretic fines filtering counteracts a recognized problem in electroplating resulting from the generation of fines. Fines are relatively large pieces of anodic material (e.g. 15 to 30 microns across) which break off from the anode and are attracted to the article during electroplating. These fines are considerably larger in size than the normal ions of anodic material which are normally electroplated. The fines will be attracted to the cathode, just as the smaller sized ionic anodic material, but the plating of a relatively large number of fines will cause an uneven, roughened electroplated surface.

In order to counteract the effect of the fines, the typical electroplating practice is to enclose the anode in what is known as an anode bag. The anode bag acts as a filter. Anode bags are effective in filtering particles in the size range of about five to ten microns, but are relatively ineffective in filtering fines which are less than approximately five microns.

SUMMARY OF THE INVENTION

In accordance with the basic improvements of the present invention, an apparatus for electroplating an article can be made of a relatively small physical size. Each individual article can be individually electroplated one at a time or in groups of two or more without experiencing uneven electrodeposition of the desired metal over its surface due to substantially uneven and locally concentrated electroplating fields. A more effective means of electrophoretically filtering the electroplating bath to remove fines is also provided.

In accordance with one of the improvements available from the present invention, an anode is formed as an array of a plurality of individual anode segments arranged generally in a predetermined configuration. The anode segments of the configuration form a plurality of different-sized, predetermined patterns which increase in size from a center location of the anode array to the outer peripheral location of the anode array. Selected ones of the individual anode segments forming a selected pattern are selectively energized during the electroplating process. The size of the pattern and the ones of the anode segments which are energized are selected with reference to the size and aspect ratio of the article to be electroplated, thereby establishing a relatively comparable or somewhat smaller sized anode with respect to the size of the article to be electroplated. To accommodate a printed circuit board as an article to be electroplated, the anode array is preferably made planar. The distance separating the anode array from the printed circuit board may be made relatively small, in terms of a few inches, because the electroplating field from the selected and energized pattern of anode segments is substantially uniform at the surface of the printed circuit board, thereby avoiding the uneven buildup of electrolytically deposited material over certain areas of the circuit board. Also, adjusting the effective size of the anode has the effect of diminishing the need for relatively large physical dimensions of the electroplating bath, since the relatively large dimensions were previously employed to flatten or more uniformly distribute the electroplating field from the anode to the article.

An effective electrophoretic filter for filtering the fines from the electroplating bath may be achieved by utilizing porex material, preferably a planar sheet of porex material positioned generally in a plane parallel to and between the planar anode array and the article being electroplated. The porex material is preferably a sheet of porous polyethylene or polypropylene material, wherein the porous passageways through the material are of a progressively decreasing size from one side of the material to the other. The larger sized openings of the progressively decreasing passageways through the material face the anode, thereby trapping and stopping the larger fines while letting the smaller fines progress onwardly through the passageways until either they too are stopped or they have passed through the passageways because they are so sufficiently small as to not be objectionable.

The scope of the present invention is defined by the appended claims. The nature and details of the present invention can be better understood by reference to the following detailed description of a preferred embodiment of the invention taken in conjunction with the accompanying drawings.

BRIEF DESCRIPTION OF THE DRAWINGS

FIG. 1 is a perspective view of an electroplating apparatus embodying the present invention.

FIG. 2 is a vertical section view taken substantially in the plane of line 2—2 of FIG. 1.

FIG. 3 is a transverse section view taken substantially in the plane of line 3—3 of FIG. 2.

FIG. 4 is an exploded perspective view of anode segments of an anode array shown in FIG. 3.

FIG. 5 is an enlarged partial section illustration of a portion of an electrophoretic fines filter used in the apparatus as shown in FIG. 2.

DESCRIPTION OF PREFERRED EMBODIMENTS

The improvements of the present invention are discussed in conjunction with an electroplating apparatus 10 illustrated in FIGS. 1 and 2. The electroplating bath 10 includes an outer housing 12 which is preferably formed of an electrically insulating plastic material. The housing 12 includes means in the form of a centered downward extending receptacle 14 which defines a bath for an electroplating solution 16. In a situation where copper is being electroplated, the bath 16 is a copper sulfate solution commonly referred to as acid copper. The plastic material of the housing 12 and receptacle 14 resists the toxic and corrosive effects of the bath 16. As can be seen in FIGS. 1 and 2, the housing 12 and receptacle 14 are of relatively compact dimensions, unlike the relatively large prior art configurations.

The electroplating apparatus 10 includes a pair of anodes, each of which is in the form of an anode array 20, shown in FIGS. 2, 3 and 4. Each anode array 20 includes a center anode segment 22 and a plurality of generally U-shaped anode segments 24, 26, 28, 30, 32 and 34. Each of the U-shaped anode segments generally nests within the adjoining outer U-shaped anode segment, while being separated only by relatively small space. The innermost center segment 22 nests within the U-shaped space of the smallest U-shaped segment 24. Each of the anode segments 22, 24, 26, 28, 30, 32 and 34 provides a generally flat exterior vertical surface, thereby providing a generally planer orientation of the anode array 20, as is shown in FIG. 2. Furthermore, the generally squared or rectangular U-shape of the U-shaped anode segments and the center segment create a rectangular cross-sectional configuration to the planar face of each anode array 20, as is shown in FIG. 3.

Each of the anode segments is suspended from an upper support member 36, which is preferably formed of plastic to resist the corrosive effects of the bath 16 and to achieve an electrical insulating effect between the anode segments. The anode segments are held suspended from the support member 36 by fasteners such as non-corrosive titanium machine screws 38. An individual electrical conductor 40 is connected to at least one of the screws 38 which connects each anode segment to the support member 36. By selectively energizing ones of the anode segments by means of the conductors 40, the anode segments become effective as anodes in an electroplating cell.

The support member 36 for each anode array is connected to the housing 12 by the fasteners 42, as shown in FIGS. 1 and 3. A handle 44 extends upward above each support member 36 to allow each anode array to be lifted from the bath 16 and the housing 12.

The two anode arrays 20 are positioned at opposite sides of the bath as is shown in FIG. 2. The article to be electroplated, in this case a printed circuit board 50, is positioned between the two anode arrays 20. This article 50 becomes the electrical cathode of an electrolytic cell during electroplating.

The printed circuit board 50 is suspended in the bath 16 by a clamp 52. The clamp 52 includes a thumbscrew 53 or other similar fastening device for the purpose of attaching and suspending or supporting the article to be electroplated in the bath. The clamp 52 is electrically connected by a conductor 54 to become the cathode of a source of electroplating potential. The clamp 52 is mechanically connected to an electrically insulating cap member 56 which also extends across the receptacle 14 of the housing 12, as is shown in FIG. 1. A handle 58 extends above the cap member 56 to allow the article (printed circuit board 50) to be inserted into and removed from the bath 16 at the start and end of the electroplating process. The cap member 56 is not permanently connected to the housing 12, to allow the easy removal and insertion of the article to be electroplated.

An electrophoretic fines filter 60 is positioned between each anode array 20 and the article to be electroplated (the printed circuit board 50) as is shown in FIG. 2. Each electrophoretic filter 60 is a generally planar sheet of porex material 62, such as porous polypropylene, porous polyethelene or teflon, as is shown in FIG. 5. The porex material 62 is characterized in that it has small passageways 64 extending transversely through the sheet (horizontally as shown in FIG. 2). The cross-sectional size of the passageways progressively decreases or tapers to a much smaller size, from one side to the other of the sheet material. (Right to left as shown in FIG. 5.) The electroplating field passing from the anode array to the article to be electroplated causes the ions to pass through the passageways 64 of the material 62. The porex material 62 progressively traps the larger fines which are emitted from the anode during electroplating. Only the ionic or metallic material of a relatively small size, for example one micron, will pass through the passageways 64 of the porex material 62 and be electroplated on the article. The passageways 64 are inherently formed in the tapering configuration during manufacturing of the material 62.

In addition to its progressive filtering characteristics, the porex material also achieves a higher degree of filtering than is known to have been previously available in electroplating. The previously attainable level of filtering from anode bags has been limited to approximately the size of five to ten microns, while the porex material of the present invention is effective in filtering metallic ions down to approximately one micron in size.

Each sheet-like electrophoretic filter 60 is retained in the bath 16 in a co-planer relationship with respect to the anode segments or the anode arrays 20 and the article or printed circuit board 50. Each filter 60 also extends completely across the receptacle 14 to form a filter barrier between each anode array 20 and the article to be electroplated (PC board 50). The filter 60 fits within a slot formed by retaining strips 66 extending on each side of the filter and completely around the outer edges of the filter in the receptacle. A support strip 68 contacts the upper end of each filter in the receptacle 14 of the housing 12. This type of retaining means allows the filters 60 to be removed so that they may be washed to clean the fines which have been trapped in the passageways or replaced.

All the ions and fines must travel through the filters 60 to reach the article (PC board 50), because of the barrier produced by the filters that extends fully across the receptacle 14. Thus all fines larger than the sizes of the smallest ends of the passageways 64 (FIG. 5) will be trapped during electroplating. To remove at least some of the trapped fines, a counterflow arrangement is provided to back flush the filters with electroplating solution from the bath. As is shown in FIGS. 1 and 2, an outlet 70 is formed in each portion of the receptacle 14 in which the anode array 20 is isolated by the filter 60. A pair of inlet manifolds 72 extend across the receptacle 14 near the top upper location where the article is retained by the clamp 52. Electroplating fluid is removed from the bath 16 at the outlets 70, is filtered by means not shown, and is returned to the manifolds 72. The electroplating fluid thus circulates in a reverse direction relative to the ion flow through the filters (left to right as shown in FIG. 5). This counterflow tends to wash some of the larger fines from the passageways 64 (FIG. 5) where they fall to the location of the outlets 70 and are then removed.

During electroplating, it is desirable to electroplate a distinct amount of metal, or copper on the printed circuit board. This is accomplished by determining the appropriate current density for the size of the article, in accordance with accepted industry standards. The amount of electroplating current can be correlated to the amount of metallic ions which are transferred, thereby establishing the degree of electroplating. A controller 62, as is shown in FIG. 1, is utilized to establish the amount of electroplating current conducted between the anode arrays 20 and the article (PC board 50), and the desired amount of electroplating voltage or potential between the anode and the article. The conductors 40 and 54 from the anode arrays 20 and the clamp 52 holding the article to be electroplated, respectively, extend to this controller 62. The amount of electroplating current delivered depends primarily on the size of the article to be electroplated.

As can be seen by comparing FIGS. 2 and 3, it can be understood that a single printed circuit board of a relatively small size, for example two inches by two inches, up to a relatively large size printed circuit board, for example ten inches by sixteen inches, can be plated at one time. Because the clamp 52 connects the printed circuit board at a top center location in the bath, the size of the anode segments and the predetermined patterns which the anode segments circumscribe are arranged extend transversely outward and vertically downward from the central location. These increasing sized anode patterns generally correlate in a face-to-face manner with the increasing sizes of printed circuit boards. Accordingly, by selectively energizing the appropriate one or ones of the anode segments, an electric field from a comparably or smaller sized anode will be established to uniformly plate the printed circuit board or article. By selecting the predetermined patterns of anode segments which are to be selectively energized during electroplating, according to the size of the article to be electroplated (also known as the aspect ratio, i.e. height and width), field concentrations at any location over the article are avoided, thereby achieving a relatively uniform layer of electroplated material.

The anode segments can be arranged in a variety of different predetermined patterns and shapes other than those shown and discussed herein. Each of the segments should be individually connectable to the source of anodic current, thereby allowing the segments to be selectively and individually energized according to the size of the predetermined pattern of the anode delivering the ions to the article to be electroplated. Although shapes other than the U-shaped arrangements provided herein may prove satisfactory, the nested arrangement of U-shaped anodic segments with the centermost rectangular center segment have proved very effective for printed circuit board use, because such printed circuit boards are generally rectangular in shape.

By empirical experimentation, it has been determined that not all of the U-shaped segments need to be energized at a particular time, for certain sized printed circuit boards. For example, in certain circumstances energizing the center segment 22, and the U-shaped segments 26, 28 and 32, may prove to be effective when electroplating a printed circuit board of approximately the outside dimensions as the U-shaped segment 34. In such circumstances, the adjoining anodic segments which are not energized function somewhat as a means for smoothing out the electrical field over the surface area of the anode array. There occurs what is known as electrolytic cross-coupling between the energized anode segment and the unenergized anode segment, and this cross-coupling has the effect of smoothing the electrical field, thereby creating a more uniform ion transfer over the whole surface of the printed circuit board 50 or other article to be electroplated.

A further discussion of which of the anode segments should be energized according to the size of the circuit board is not presented, because such information must be empirically derived. The distance between the anode array and the printed circuit board 50, the size of the individual anode segments, the configuration in which they are placed in the anode array, and the degree of cross-coupling which can occur between adjacent energized and de-energized segments, all play a role in the selection of the particular anode segments which are to be energized. Furthermore, it is virtually impossible to create a mathematical model of the electrical field within an electroplating bath, because the electrical field is subject to a variety of dynamic influences. Unlike an electrostatic field, there is a constant dynamic flow of charged ions in an electroplating bath, and as is typical, the electroplating solution flows and is agitated within the bath to disrupt the modeling of an electroplating field. Accordingly, the empirical derivation of electroplating data relative to the particular size of article to be electroplated and the anode segments is necessary. However, once that empirical data is derived, it can be placed into a computer and the computer can control which of the anode segments are energized according to the size of the printed circuit board which is to be electroplated. Furthermore, the computer can also control the amount of current to be supplied according to the energized anode segments and the size of the printed circuit board.

The details of the present invention and many of the improvements available as a result of the present invention have been described with a degree of specificity. It should be understood, however, that this degree of detail in the description has been made by way of preferred example. The actual scope of the present invention is defined by the following appended claims.

The invention claimed:

1. Apparatus for electroplating each of a plurality of different sized articles, comprising:
 a housing including means defining a receptacle for a bath of electroplating solution;
 an anode array positioned within the receptacle to contact the bath and comprising a plurality of individual anode segments arranged in a configuration to form a plurality of different-sized patterns which generally increase from a smaller size at a mid-location of the configuration to a larger size at an outer location of the configuration;
 support means for supporting an article to be electroplated in the receptacle and in the bath at a location spaced from the planar configuration of the array;
 means for electrically energizing selected ones of the anode segments to act as a variably sized anode in an electroplating cell for electroplating an article according to the configuration of the article; and
 means associated with the support means and operative for electrically connecting the article to act as a cathode in an electroplating cell.

2. Apparatus as defined in claim 1, wherein:
 the anode segments are arranged in a generally planar configuration,
 the article to be plated is generally planar, and
 the support means supports the article generally parallel to the planar configuration of the array.

3. Apparatus as defined in claim 2, wherein:
 the outer dimensions of the article are not substantially greater than the largest pattern of anode segments in the array.

4. Apparatus as defined in claim 3, further comprising:
 means for selectively energizing the anode segments of one or more patterns according to the size of the article to establish generally uniform electroplating ion transfer over the surface of the article.

5. Apparatus for electroplating an article, comprising:
 a housing including means defining a receptacle for a bath of electroplating solution;
 an anode positioned within the receptacle to contact the bath and comprising a plurality of individual anode segments arranged in a generally planar configuration, the anode segments positioned in the configuration to form a plurality of different-sized patterns which generally increase from a smaller size at a mid-location of the configuration to a larger size at an outer location of the configuration;
 the plurality of anode segments are generally U-shaped and the U-shaped segments generally nest within one another in the planar configuration;
 support means for supporting an article to be electroplated in the receptacle and in the bath at a location spaced from the planar configuration of the array;
 means for electrically energizing selected ones of the anode segments to act as anodes in an electroplating cell for electroplating; and
 means associated with the support means and operative for electrically connecting the article to act as a cathode in an electroplating cell.

6. Apparatus as defined in claim 5 wherein:
 the anode segments also include a center segment located at a top center position of the planar configuration, and
 the innermost nested U-shaped segment generally extends around the center segment, with the nested U-shaped segments extending transversely outward and downward with respect to the center segment at the top center position.

7. Apparatus as defined in claim 6 wherein:
 the support means transversely centers the article at an upper central location which is perpendicular from the top center position of the planar configuration, and
 articles of larger size extend to a greater extent transversely outward and downward from the upper central location, to face those number of nested U-shaped segments and the center segment which generally correspond to the surface area of the article.

8. Apparatus for electroplating a generally planar article, comprising:
 a housing including means defining a receptacle for a bath of electroplating solution;
 an anode array position within the receptacle to contact the bath and comprising a plurality of individual anode segments arranged in a generally planar configuration, the anode segments positioned in the configuration to form a plurality of different-sized patterns which generally increase from a smaller size at a mid-location of the configuration to a larger size at an outer location of the configuration;
 support means for supporting a generally planar article to be electroplated in the receptacle and in the bath generally parallel to the planar configuration of the anode at a location spaced from the planar configuration of the anode;
 means for selectively electrically energizing each of the anode segments to act as anodes in an electroplating cell for electroplating;
 means associated with the support means and operative for electrically connecting the article to act as a cathode in an electroplating cell; and a generally planar electrophoretic fines filter positioned in a generally parallel planar orientation between the anode array and the article.

9. Apparatus as defined in claim 8 wherein:
the electrophoretic fines filter comprises a progressive porex material.

10. Apparatus as defined in claim 9 wherein:
the electrophoretic fines filter comprises a sheet of porous polyethylene material.

11. Apparatus as defined in claim 9 wherein:
the electrophoretic fines filter comprises a sheet of porous polypropylene material.

12. A method of electroplating an article with a generally uniform thickness coating by adjusting the effective size or area of an anode to electrolytically transfer ions of the coating material from the anode at a substantially uniform deposition rate over the article, comprising the steps of:
forming an anode of a plurality of individual anode segments,
arranging the anode segments in a plurality of individual patterns of different sizes,
selecting at least one of the predetermined patterns as an anode of predetermined size which has a predetermined relationship with the size of the article to result in approximately uniform ion deposition rate over the article during electroplating, and
conducting anodic current from only the anode segments of each selected pattern to electroplate the article.

13. A method as defined in claim 12, further comprising the step of:
selecting a plurality of predetermined patterns, the largest of the selected predetermined patterns circumscribing approximately the size of the article, the others of the selected predetermined patterns being smaller than the largest selected pattern.

14. A method as defined in claim 13 further comprising the step of:
placing an electrophoretic fines filter between the selected predetermined patterns and the article.

15. In an electroplating apparatus comprising an anode, means defining a cathode including an article to be plated, and an electroplating solution in a bath, an improvement in combination therewith comprising:
a barrier of plastic porex material separating the anode and the cathode and which characteristically includes a plurality of passageways through which ions flow during electroplating, the passageways characteristically decreasing in cross-sectional size in relation to the direction in which the ions are transported in the bath during electroplating.

16. An invention as defined in claim 15 wherein the porex material is porous polypropylene.

17. An invention as defined in claim 15 wherein the porex material is porous polyethylene.

18. An invention as defined in claim 15 further comprising:
means for establishing a counterflow of electroplating solution through the porex material in a direction reverse to the direction in which the ions are transported

* * * * *